(12) United States Patent
Pinckney et al.

(10) Patent No.: US 6,724,001 B1
(45) Date of Patent: Apr. 20, 2004

(54) ELECTRON BEAM LITHOGRAPHY APPARATUS WITH SELF ACTUATED VACUUM BYPASS VALVE

(75) Inventors: David J. Pinckney, Newtown, CT (US); Rodney A. Kendall, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/338,922

(22) Filed: Jan. 8, 2003

(51) Int. Cl.$^7$ .......................... H01J 37/00; H01J 37/06; H01L 21/00; H01L 21/30
(52) U.S. Cl. .............................. 250/492.1; 250/492.2; 250/492.22; 250/492.3; 250/492.21; 250/397; 250/398; 250/440.11; 250/441.11; 250/442.11; 430/5; 430/296; 430/311
(58) Field of Search ..................... 250/492.1, 492.2, 250/492.21, 492.22, 492.3, 493.1, 440.11, 441.11, 442.11, 397, 398; 430/5, 296, 311

(56) References Cited

U.S. PATENT DOCUMENTS

| 4,298,803 | A | * | 11/1981 | Matsuura et al. | ........ | 250/492.2 |
| 4,516,030 | A | * | 5/1985 | Tsuchikawa et al. | ..... | 250/492.2 |
| 5,092,729 | A | * | 3/1992 | Yamazaki et al. | ..... | 414/225.01 |
| 5,580,419 | A | * | 12/1996 | Berenz | ........................ | 438/171 |
| 5,914,493 | A | * | 6/1999 | Morita et al. | ............. | 250/492.2 |
| 6,573,520 | B1 | * | 6/2003 | Satoh et al. | ............. | 250/492.3 |

OTHER PUBLICATIONS

Hans C. Pfeiffer & John Hartley, US IBM, "Advanced Mask-Making with a Variable-Shaped Electron Beam", pp. 129-134.

J. Vac. Sci. Technol. B 16(6), M.A. Sturans, et al. "ELS: One tool advanced x-ray and chrome on glass mask making", Nov./Dec. 1998, pp. 3164-3167.

* cited by examiner

*Primary Examiner*—John R. Lee
*Assistant Examiner*—David A. Vanore
(74) *Attorney, Agent, or Firm*—Harold Huberfeld

(57) ABSTRACT

An electron beam lithography apparatus has a first chamber for holding a workpiece with the first chamber having an outer wall with an opening therein. A second chamber has an electron beam column mounted therein, with the second chamber positioned adjacent the first chamber and having an outer wall having a portion in common with the portion of the outer wall of the first chamber containing the opening. An electron beam column in the second chamber includes an aperture and generates an electron beam through the aperture and the opening at the workpiece. The apparatus includes a first pump for creating a vacuum in the first chamber, a second pump for creating a vacuum in the second chamber, a first vent for permitting gas to enter the first chamber for increasing the pressure in the first chamber, and a second vent for permitting gas to enter the second chamber for increasing the pressure in the second chamber. A balancing bypass valve in the common wall between the first and second chambers (i) operates in a first mode to permit gases to flow from the first chamber to the second chamber when the pressure in said second chamber exceeds the pressure in the first chamber, (ii) operates in a second mode to permit gases to flow from the second chamber to the first chamber when the pressure in the first chamber exceeds the pressure in the second chamber, and (iii) operates in a third mode to seal the first chamber from the second chamber when the pressures in the first and second chambers are equal.

17 Claims, 4 Drawing Sheets

ELECTRON BEAM LITHOGRAPHY APPARATUS WITH SELF ACTUATED VACUUM BYPASS VALVE

BACKGROUND OF THE INVENTION

The present invention relates generally to the field of electron beam lithography and more particularly to an electron beam lithography apparatus having a contamination reducing bypass valve.

The need to continually reduce feature size is ongoing in the manufacture of semiconductor integrated circuits. This need creates a corresponding need to produce masks used in optical and x-ray lithography having continually decreasing feature sizes defined thereon. Electron beam lithography systems have been used for many years to manufacture such masks. One such system is the EL5 Electron Beam Lithography System manufactured by International Business Machines Corporation. The inventors have recognized that the electron beam column in such systems contains many elements, such as shaping apertures, typically made of gold foil, which are fragile and highly sensitive to contamination. The inventors have recognized that sources of contamination include (i) resist vapor created during the exposure of a mask in the process chamber of the electron beam lithography apparatus under high vacuum and (ii) particulates which are transported through the system during pump down of the apparatus to achieve a high vacuum process environment and venting of the apparatus chambers to return the environment to atmospheric pressure.

SUMMARY OF THE INVENTION

Accordingly an electron beam lithography apparatus is provided having a first chamber for holding a workpiece with the first chamber having an outer wall with an opening therein. The apparatus further includes a second chamber having an electron beam column mounted therein, with the second chamber positioned adjacent the first chamber and having an outer wall having a portion in common with the portion of the outer wall of the first chamber containing the opening. An electron beam column in the second chamber includes an aperture and generates an electron beam through the aperture and the opening at the workpiece. The apparatus further includes a first pump for creating a vacuum in the first chamber, a second pump for creating a vacuum in the second chamber, a first vent for permitting gas to enter the first chamber for increasing the pressure in the first chamber, and a second vent for permitting gas to enter the second chamber for increasing the pressure in the second chamber. The apparatus further includes a balancing bypass valve in the common wall between the first and second chambers for (i) operating in a first mode to permit gases to flow from the first chamber to the second chamber when the pressure in said second chamber exceeds the pressure in the first chamber, (ii) operating in a second mode to permit gases to flow from the second chamber to the first chamber when the pressure in the first chamber exceeds the pressure in the second chamber, and (iii) operating in a third mode to seal the first chamber from the second chamber when the pressures in the first and second chambers are equal.

Accordingly, a feature of the present invention is the provision of an electron beam lithography apparatus which minimizes contamination of the electron beam column components during pressure changes within the apparatus.

Another feature of the present invention is the provision of an electron beam lithography apparatus which minimizes contamination of the electron beam column in a relatively simple and cost effective manner.

Other advantages and novel features of the present invention will become apparent from the following detailed description of the invention when considered in conjunction with the accompanying drawings.

DESCRIPTION OF THE PREFFERRED EMBODIMENTS

Figure 1A:
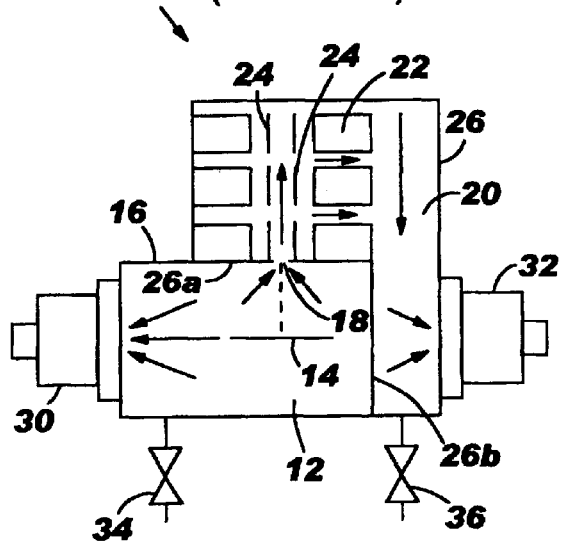
FIGS. 1A–1C show schematic diagrams depicting the operation of a prior electron beam lithography apparatus.
Figure 1B:
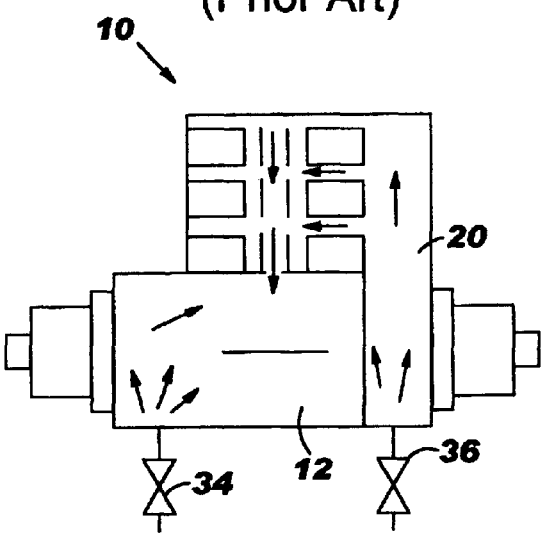
Figure 1C:
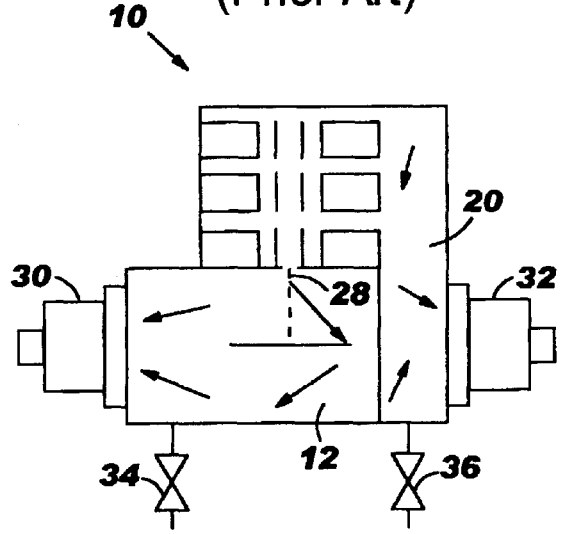

To better understand the significance of the present invention, FIGS. 1A–1C show a schematic representation of the operation of an electron beam lithography apparatus presently manufactured by International Business Machines Corporation under the model number EL5. Such an apparatus is further described in "EL5: One tool for advanced x-ray and chrome on glass mask making", by Sturans et al. in J. Vac. Sci. Technol. B 16(6), Nov./Dec. 1998, pages 3164–3167 and in "Advanced Mask-Making with a Variable-Shaped Electron Beam", by Pfeiffer et al. in Semiconductor Fabtech-15$^{th}$ Edition, Winter, 2002, pages 129–134. Referring to FIG. 1A, such an electron beam lithography apparatus 10 includes a chamber 12 for holding a workpiece 14 in a known manner. The workpiece 14 is typically a mask used in the manufacture of integrated circuits. The chamber 12 includes and is enclosed by an outer wall 16 having an opening 18 therein. A second chamber 20 has an electron beam column 22 mounted therein. The column includes a plurality of apertures 24 mounted therein for shaping the electron beam generated in the column 22. The apertures 24 are preferably made of cylindrical gold foil elements with the diameter of the cylinder defining the aperture. The inventors have found that such apertures are fragile and sensitive to contamination. The chamber 20 includes and is enclosed by an outer wall 26 having portions 26a and 26b in common with the outer wall 16 of chamber 12. The opening 18 is in the common wall 26a and is preferably a minimal size conductance limiting aperture. The opening 18 is the only flow path between chambers 12 and 20. The electron beam column is mounted on the common wall 26a and positioned to generate an electron beam 28 directed through the opening 18 at the workpiece 14 in chamber 12.

A pump 30 is mounted on wall 16 of chamber 12 for creating a vacuum in chamber 12. Preferably pump 12 is capable of creating a high vacuum in chamber 12 of less than 5E-7 Torr. A pump 32 is mounted on the wall 26 of chamber 20 for creating a high vacuum in chamber 20 equal to the vacuum in chamber 12. A vent 34 is mounted on the wall 16 of chamber 12. A vent 36 is mounted on the wall 26 of chamber 20. The vents 34 and 36 are controlled, in a known manner, by a mechanism (not shown) external to the chambers 12 and 20 to vent the chambers 12 and 20 to gas at atmospheric pressure, thereby permitting gas to enter the chambers 12 and 20 and increasing the pressures in chambers 12 and 20, respectively, until the chambers 12 and 20 are returned to atmospheric pressure.

In FIG. 1C the electron beam apparatus 10 is shown in a high vacuum condition, where any gas flow within the chambers 12 and 20 is a random, statistical process referred to as molecular flow. In this mode of operation, flow between chambers 12 and 20 is independent of pressure because the pressures in chambers 12 and 20 are equal. Therefore, flow between chambers 12 and 20 can be minimized by the geometry of the conductance limiting aperture 18, thus effectively minimizing any contamination of critical and sensitive components in the electron beam column 22, such as the apertures 24 caused by process generated byproducts.

In FIG. 1A the electron beam apparatus 10 is shown during a mode of operation in which the pumps 30 and 32 are operating to create a high vacuum condition within the chambers 12 and 20. During this mode of operation, the gas in chambers 12 and 20 initially behaves as a homogeneous fluid, then becomes turbulent and finally viscous as the pressures in chambers 12 and 20 decrease. As the gas passes through these phase changes the inventors have observed that it can entrap and carry particulates. Since chambers 12 and 20 are of unequal volumes and since the pumps 30 and 32 operate independently, a pressure differential is likely to be created between chambers 12 and 20. This pressure differential will case contaminated and potentially physically damaging gas to flow past the critical components in electron beam column 22, such as apertures 24. Such gas flow in either direction, up or down the column 22 has the potential to cause the same problem. FIG. 1A shows the condition where the pressure in chamber 12 is greater than the pressure in chamber 20, thus causing gas from chamber 12 to flow through the aperture 18 and up the column 22.

In FIG. 1B electron beam apparatus 10 is shown during a mode of operation in which the vents 34 and 36 are opened to reduce the pressures in chambers 12 and 20 and return those pressures to atmospheric pressure. During this mode of operation, the gas in chambers 12 and 20 pass through the same phase changes, but in reverse order thus casing a similar contaminating flow condition. FIG. 1B shows the condition where the pressure in chamber 20 exceeds the pressure in chamber 12, thus causing gas from chamber 20 to flow down the column 22 and through aperture 18.

Figure 2:
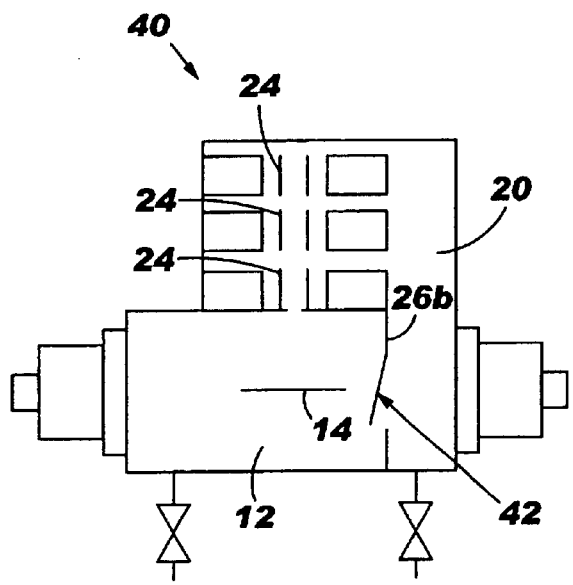
FIG. 2 shows a schematic diagram of the electron beam lithography apparatus of the present invention.
Figure 3A:
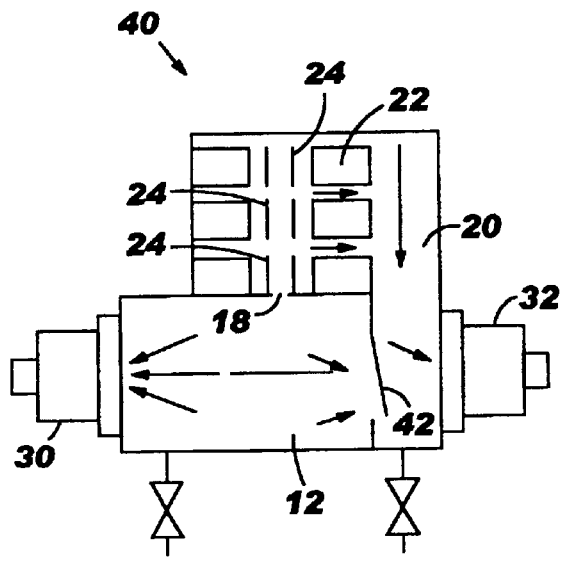
FIGS. 3A–3C show schematic diagrams depicting the operation of the electron beam lithography apparatus of the present invention.
Figure 3B:
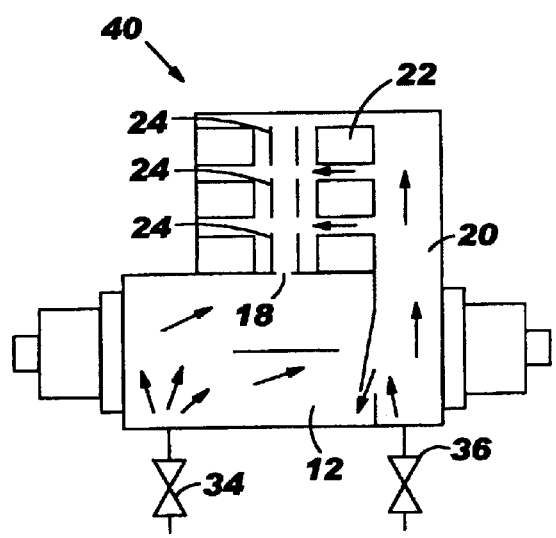
Figure 3C:
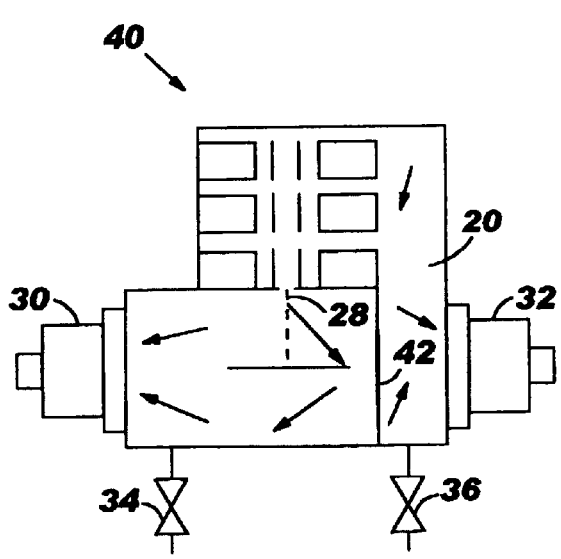

The electron beam apparatus of the present invention is shown in FIG. 2 with those elements that are common to the apparatus described in FIGS. 1A–1C being identified by the same reference numerals. An electron beam lithography apparatus 40 has a balancing bypass valve 42 mounted in the common wall 26b between chambers 12 and 20. FIG. 3A shows the operation of the apparatus 40 during a first mode of operation in which, for example, the pumps 30 and 32 are operating to create a high vacuum condition within the chambers 12 and 20. In this mode of operation the pressure in chamber 12 exceeds the pressure in chamber 20 thus causing the bypass valve 42 to open in proportion to the pressure differential between chambers 12 and 20 and permit gas from chamber 12 to flow to chamber 20 and out of chamber 20 through pump 32. This flow path bypasses the aperture 18 and correspondingly column 22 and apertures 24 thus minimizing contamination of those components. FIG. 3B shows the operation of the apparatus 40 during a second mode of operation in which, for example, the vents 34 and 36 are opened to the atmosphere thus increasing the pressure in chambers 12 and 20 until the pressure return to and equalizes at atmospheric pressure. In this mode of operation the pressure in chamber 20 exceeds the pressure in chamber 12 thus causing the bypass valve 42 to open in proportion to the pressure differential between chambers 20 and 12 and permit gas from chamber 20 to flow to chamber 12. This flow path also bypasses the aperture 18 and correspondingly column 22 and apertures 24 thus minimizing contamination of those components. FIG. 3C shows the operation of the apparatus 40 during a third mode of operation in which the apparatus 40 is operating under high vacuum, the pumps 30 and 32 are inoperative, the vents 34 and 36 are closed thereby sealing the chambers 12 and 20 from the environment and the pressures in chambers 12 and 20 are equal. In this mode of operation, the valve 42 is closed, thus sealing the chamber 12 from the chamber 20 and preventing flow between chambers 12 and 20 and the apparatus 40 operates in the same manner as the apparatus 10.

Figures 4A, 4B, 4C:
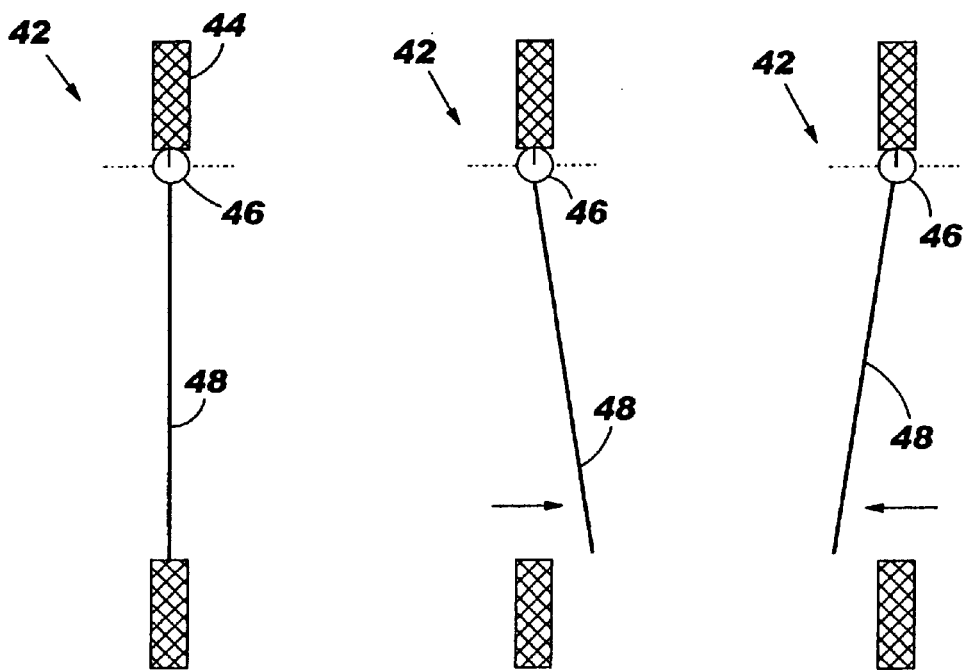
FIGS. 4A–4C show schematic diagrams depicting the operation of the bypass valve shown in FIG. 2 and FIGS. 3A–3C in greater detail.

Referring to FIGS. 4A–4C, in one embodiment of the present invention the balancing bypass valve 42 has a rectangular frame 44 mounted in the vertical common wall 26b between chambers 12 and 20. The bypass valve 42 further includes a hinge 46 retained by the frame 44 and a rectangular valve gate 48 suspended from the hinge 46 and adapted to rotate thereabout. Thus, as shown in FIG. 4A, the pressures in chambers 12 and 20 are equal and the valve gate 48 is closed sealing chamber 12 from chamber 20 and thereby retaining any particulates generated during the processing of workpiece 14 from entering chamber 20. FIG. 4B corresponds to the mode of operation depicted in FIG. 3A where the pressure in chamber 12 exceeds the pressure in chamber 20 thereby causing the valve gate 48 to rotate about the hinge 46 in proportion to the pressure differential between chambers 12 and 20 and permitting gas to flow from chamber 12 to chamber 20. FIG. 4C corresponds to the mode of operation depicted in FIG. 3B where the pressure in chamber 20 exceeds the pressure in chamber 12 thereby causing the valve gate 48 to rotate about the hinge 46 in proportion to the pressure differential between chambers 20 and 12 and permitting gas to flow from chamber 20 to chamber 12.

Figure 5:
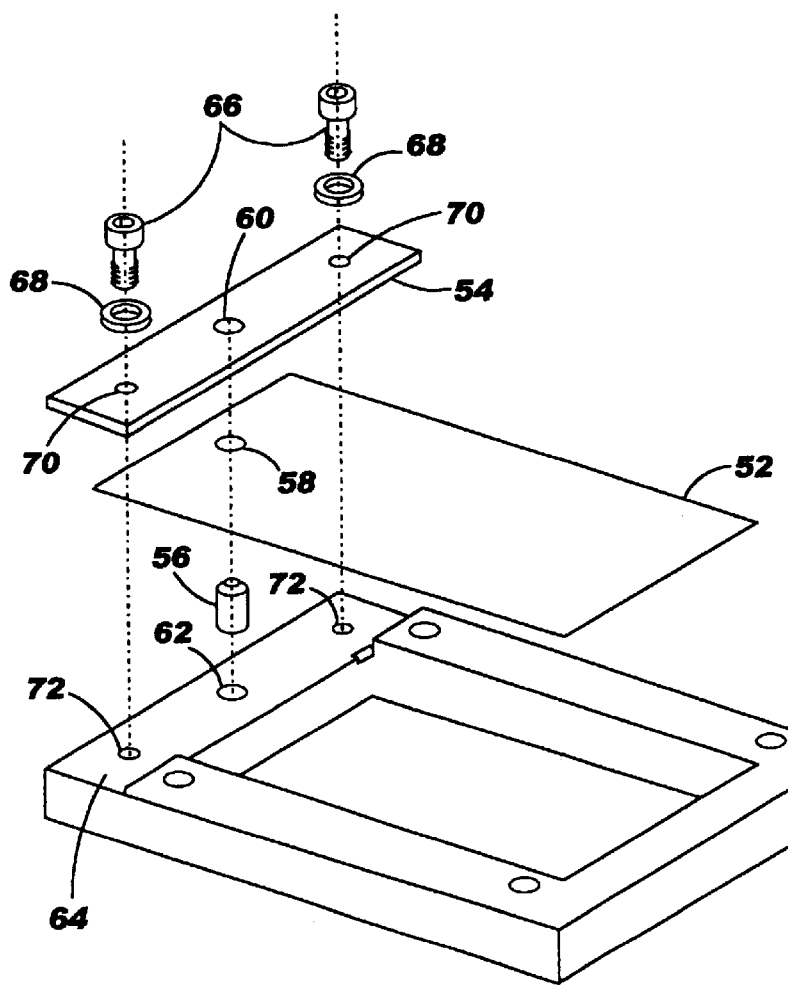
FIG. 5 shows an exploded view of a second embodiment of the bypass valve of the present invention.
Figure 6:
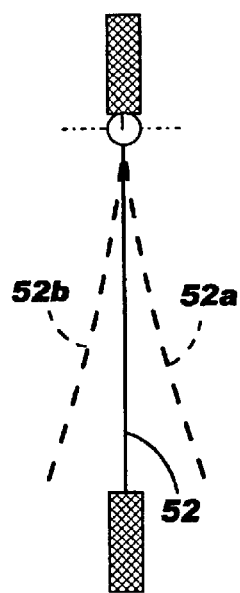
FIG. 6 shows a schematic diagram depicting the operation of the bypass valve shown in FIG. 5.

Referring to FIGS. 5 and 6, a second embodiment of the balancing bypass valve 42 includes a rectangular frame 50 mounted in the vertical common wall 26b between chambers 12 and 20. A valve gate 52 made of a rectangular sheet of flexible material is retained along at least a portion thereof at the top of the frame 50 by a clamping plate 54 and a dowel pin 56 which passes through a hole 58 in the gate 52 and a hole 60 in clamping plate 54 and seats by press fit in a hole 62 in offset portion 64 of frame 50. The clamping plate 54 is fastened to the offset portion 64 by a pair of socket head machine screws 66 adapted to pass through washers 68 and holes 70 in clamping plate 54 and to threadingly engage threaded boles 72 thereby clamping valve gate 52 to the top of frame 50. The valve gate 50 is preferably made of stainless steel approximately 50 microns thick. The valve gate 52 is then suspended from the top 54 of the frame 50 and to open and close in response to pressure differentials between chambers 12 and 20 in the sane manner as the valve gate 48. In FIG. 6 the valve gate 52 flexes to position 52a in the mode of operation depicted in FIG. 3A and flexes to position 52b in the mode of operation depicted in FIG. 3B.

Thus, the present invention provides an electron beam lithography apparatus which minimizes contamination of the electron beam column components during pressure changes within the apparatus in a relatively simple and cost effective manner.

While there have been described what are at present considered to be the preferred embodiments of the present invention, it will be obvious to those skilled in the art that various changes or modifications may be made therein, without departing from the invention, and it is, therefore, aimed in the appended claims to cover all those changes and modifications as follow in the true spirit and scope of the invention.

What is claimed is:

1. An electron beam lithography apparatus comprising:
   (a) a first chamber for holding a workpiece, said first chamber having an outer wall with an opening therein;
   (b) a second chamber having an electron beam column mounted therein, said second chamber positioned adjacent said first chamber and having an outer wall having a portion in common with the portion of the outer wall of said first chamber containing said opening, an electron beam column including an aperture in said second chamber for generating an electron beam through said aperture and said opening at said workpiece;
   (c) a first pump for creating a vacuum in said first chamber;
   (d) a second pump for creating a vacuum in said second chamber;
   (e) first venting means for permitting gas to enter said first chamber for increasing the pressure in said first chamber;
   (f) second venting means for permitting gas to enter said second chamber for increasing the pressure in said second chamber; and
   (g) a balancing bypass valve in the common wall between said first and second chambers for (i) operating in a first mode to permit gases to flow from said first chamber to said second chamber when the pressure in said second chamber exceeds the pressure in said first chamber, (ii) operating in a second mode to permit gases to flow from said second chamber to said first chamber when the pressure in said first chamber exceeds the pressure in said second chamber, and (iii) operating in a third mode to seal said first chamber from said second chamber when the pressures in said first and second chambers are equal.

2. An electron beam lithography apparatus as set forth in claim 1 wherein when operating in said first mode of operation said first and second pumps operate to reduce the pressure said first and second chambers and said first and second venting means are closed thereby sealing said first and second chambers from the external environment.

3. An electron beam lithography apparatus as set forth in claim 1 wherein when operating in said second mode of operation said venting means are open and said first and second pumps are inoperative thereby increasing the pressure in said first and second chambers.

4. An electron beam lithography apparatus as set forth in claim 1 wherein when operating in said third mode of operation said first and second pumps are inoperative, said first and second venting means are closed thereby sealing said first and second chambers from the environment and said electron beam column generates an electron beam directed through said aperture and said opening at said workpiece.

5. An electron beam lithography apparatus as set forth in claim 1 wherein said balancing bypass valve is a flapper valve having a hinge mounted in the common wall between said first and second chambers and a valve gate suspended from said hinge and adapted to rotate thereabout in response to a pressure differential between said first and second chambers.

6. An electron beam lithography apparatus as set forth in claim 5 wherein when operating in said flapper valve includes a frame mounted in the common wall between said first and second chambers with said hinge being retained by said frame thereby permitting said valve gate to rotate within said frame.

7. An electron beam lithography apparatus as set forth in claim 6 wherein said frame and said valve gate are rectangular.

8. An electron beam lithography apparatus as set forth in claim 6 wherein said common wall between said first and second chambers is a vertical wall and wherein said valve gate is suspended from said hinge.

9. An electron beam lithography apparatus as set forth in claim 5 wherein the amount of rotation of said valve gate is proportional to the pressure differential between said first and second chambers.

10. An electron beam lithography apparatus as set forth in claim 1 wherein the amount of gas permitted to flow through said balancing bypass valve in said first and second operating modes is proportional to the pressure differential between said first and second chambers.

11. An electron beam lithography apparatus as set forth in claim 1 wherein said workpiece is a mask used in the manufacture of integrated circuits.

12. An electron beam lithography apparatus as set forth in claim 1 wherein said balancing bypass valve includes a frame mounted in the common wall between said first and second chambers and said valve gate comprises a sheet of flexible material retained by said frame along a portion thereof thereby permitting said valve gate to flex within said frame.

13. An electron beam lithography apparatus as set forth in claim 1 wherein said electron beam column includes at least a second aperture for shaping an electron beam.

14. A method of performing electron beam lithography in an electron beam lithography apparatus comprising:
   (a) placing a workpiece in a first chamber of said apparatus, said first chamber having an outer wall with an opening therein;
   (b) providing said apparatus with a second chamber having an electron beam column mounted therein, said second chamber positioned adjacent said first chamber and having an outer wall having a portion in common with the portion of the outer wall of said first chamber containing said opening, wherein the electron beam column includes an aperture in said second chamber for generating an electron beam through said aperture and said opening at said workpiece;
   (c) providing a first pump for evacuating said first chamber;
   (d) providing a second pump for evacuating said second chamber;
   (e) providing a first vent for permitting gas to enter said first chamber for increasing the pressure in said first chamber;
   (f) providing a second vent for permitting gas to enter said second chamber for increasing the pressure in said second chamber;
   (g) providing a balancing bypass valve in the common wall between said first and second chambers;
   (h) operating said apparatus in a first mode to permit gases to flow from said first chamber to said second chamber when the pressure in said second chamber exceeds the pressure in said first chamber;

(i) operating said apparatus in a second mode to permit gases to flow from said second chamber to said first chamber when the pressure in said first chamber exceeds the pressure in said second chamber; and (j) operating said apparatus in a third mode to seal said first chamber from said second chamber when the pressures in said first and second chambers are equal.

15. A method of performing electron beam lithography as set forth in claim 14 wherein operating said apparatus in said first mode further includes operating said first and second pumps and closing said first and second vents to reduce the pressure in said first and second chambers.

16. A method of performing electron beam lithography as set forth in claim 14 wherein operating said apparatus in said second mode further includes opening said first and second vents and disabling the operation of said first and second pumps to raise the pressure in said first and second chambers.

17. A method of performing electron beam lithography as set forth in claim 14 wherein operating said apparatus in said third mode further includes disabling the operation of said first and second pumps and closing said first and second vents thereby sealing said first and second chambers from the environment and maintaining a high vacuum in said first and second chambers.

* * * * *